United States Patent [19]

Arnold et al.

[11] 4,323,943
[45] Apr. 6, 1982

[54] PROTECTION CIRCUITS

[75] Inventors: Victor F. Arnold, St. Albans; Roger C. Dixon, Luton, both of England

[73] Assignee: Marconi Instruments Limited, Chelmsford, England

[21] Appl. No.: 78,597

[22] Filed: Sep. 14, 1979

[30] Foreign Application Priority Data

Sep. 15, 1978 [GB] United Kingdom ............... 37970/78

[51] Int. Cl.³ ............................................. H02H 3/00
[52] U.S. Cl. .................................... 361/114; 361/182; 361/187
[58] Field of Search .................. 361/87, 114, 182, 187, 361/58, 86, 94; 324/115; 340/661, 662, 663, 664

[56] References Cited

U.S. PATENT DOCUMENTS

| | | | |
|---|---|---|---|
| 3,536,998 | 10/1970 | Nordholm | 324/115 |
| 3,544,844 | 12/1970 | Pellegrino | 361/114 X |
| 3,703,717 | 11/1972 | Kuster | 361/187 X |
| 3,818,276 | 6/1974 | Jacobs | 361/114 |
| 4,075,559 | 2/1978 | Chaprnka et al. | 324/115 |

Primary Examiner—Reinhard J. Eisenzopf
Attorney, Agent, or Firm—Diller, Ramik & Wight

[57] ABSTRACT

A protection circuit suitable for use with electronic test equipment contains a switch which is open circuited if an overload condition is detected. The opening of the switch isolates the overload detector from the applied overload thereby allowing the detector to have a relatively low power handling capability. If the switch is manually closed whilst the overload condition persists the switch is automatically re-opened within a short predetermined time.

1 Claim, 1 Drawing Figure

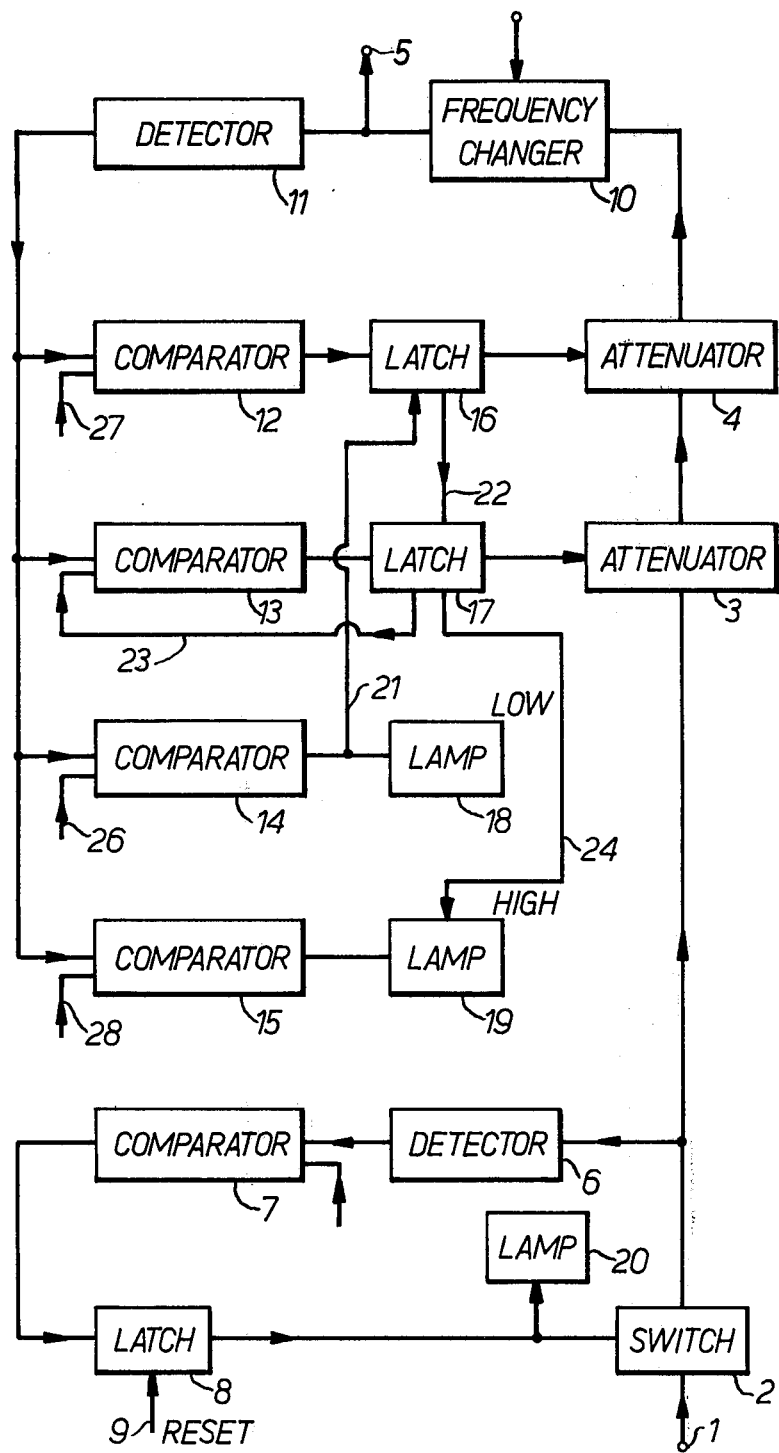

PROTECTION CIRCUITS

This invention relates to protection circuits which are suitable for use with certain kinds of electronic equipment which receive signals of varying frequency having wide variations in amplitude level. Commonly the measuring circuits themselves within the electronic equipment are capable of handling signals having only a low dynamic range and they can be damaged by the application of signals having excessive amplitude levels. Whilst it is desirable to protect the equipment against the application of such excessive amplitude levels, it is nevertheless undesirable to restrict the application of a signal which is within acceptable limits and the present invention seeks to provide an improved protection circuit.

According to this invention a protection circuit includes a switch positioned between a radio frequency detector and an input terminal which in operation receives an applied radio frequency signal; means for opening said switch when an output signal provided by said radio frequency detector exceeds a predetermined level which is representative of an overload condition; means for latching the switch in this condition manually operable re-set means for closing said switch; and means for re-opening said switch within a predetermined time duration of said switch being closed if the overload condition persists.

Preferably means are provided for preventing repeated operation of said switch if the manually operable re-set means is maintained in the re-set condition whilst the overload condition persists.

Preferably said switch is constituted by an electromagnetically operated relay which when not energised, holds said switch open.

Preferably again a visual indication is provided of the conductive state of said relay.

Preferably the protection circuit also includes at least one switchable attenuator which follows the switch. This allows the dynamic range of the electronic equipment with which the protection circuit is used to be increased. The attenuator is subject to an overload condition only whilst said switch is closed, and said predetermined time duration is chosen so that it is sufficiently short to avoid permanently damaging the attenuator.

Preferably again a plurality of switchable attenuators are provided in series, the individual attenuators being progressively brought into or out of circuit in dependence on changes in the level of the applied signal.

Preferably yet again means are provided for ensuring that when said attenuators are switched into or out of circuit the resulting change in signal level does not cause the attenuators to be switched out of or into circuit respectively until a predetermined change occurs in the level of the applied radio frequency signal at said input terminal.

The invention is further described by way of example with reference to the accompanying drawing which illustrates a protection circuit in accordance with the invention.

Referring to the drawing, a protection circuit is shown which is suitable for use with a modulation meter. A radio frequency signal of variable amplitude is applied to an input terminal 1 and is passed via a switch 2, switchable attenuators 3 and 4 and frequency changer 10 to an output terminal 5, which in normal use is connected to the modulation meter. The output of the switch 2 is fed to a radio frequency detector 6, which produces from the signal applied to it a d.c. level which is compared at a comparator 7 with a reference level indicative of an overload condition. The output of the comparator 7 is fed via a latch 8 to control the operation of the switch 2 and an indicator lamp 20.

A frequency changer 10 receives the input signal via switch 2 and attenuators 3 and 4 and produces a signal having a fixed predetermined frequency, but having an amplitude which is the same as, or directly related to, the amplitude of the signal applied to it. This fixed frequency signal is applied to a linear detector 11, which produces a d.c. output level which is closely related to the amplitude of the applied fixed frequency signal. The output of the detector 11 is applied to respective inputs of comparators 12, 13, 14 and 15. The comparator 12 controls the operation of the switchable attenuator 4 via a latch 16. The comparator 13 controls the operation of the switchable attenuator 3 via a latch 17, and the comparators 14 and 15 respectively control warning lamps 18, 19 which indicate when the input signal applied to terminal 1 is excessively low or excessively high. In practice the lamps 18, 19 and 20 would conveniently be light emitting diodes.

The circuit shown in the drawing operates as follows. When a very low amplitude signal is applied to input terminal 1, the switch 2 is held closed and the two switchable attenuators 3 and 4 are switched so as to be short circuited so that the signal is passed to the frequency changer 10 without attenuation. If the signal level is too low to enable a reliable masurement to be made on it by circuits coupled to output terminal 5, the low level is detected by the comparator 14 and the warning lamp 18 is energised. A reference low level signal is applied over line 26 to the second input of the comparator 14. Additionally the comparator 14 re-sets the latch 16 via line 21 to ensure that the attenuator 4 is not in circuit. As the input level applied to terminal 1 increases the comparator 12 detects when a first threshold value is reached and enables latch 16, which switches attenuator 4 into circuit. A suitable reference threshold level is applied over line 27. The attenuator provides approximately 12 dB attenuation to the input signal. At the same time a signal is sent from latch 16 over line 22 to prevent operation of the attenuator 3 until attenuator 4 has been brought into circuit. It will be appreciated that when attenuator 4 is in circuit the level of the signal obtained at detector 11 and applied to comparators 12 and 13 reduces in amplitude but not to the level at which the low comparator 14 is triggered. If the signal is still sufficiently great to exceed an initial reference level applied to comparator 13 over line 23 and output from this comparator is sent via the latch 17 to bring the second attenuator 3 into circuit, so as to provide a further 12 dB attenuation. At the same time the latch 17 adjusts the reference level applied to the comparator 13 over line 23 so as to decrease it. This in effect provides the latching action.

Both of the comparators 12 and 13 are given hysterisis in their input signal latch operating levels. That is when their respective attenuators 4 or 3 are switched into circuit, thus reducing the signal input level to the comparator 12 or 13, the comparators do not immediately unlatch the latches 16 or 17 and a reduction in the signal level at terminal 1 must occur before either of the latches 16 or 17 will unlatch and allow the attenuator 4 or 3 to be short-circuited. When either attenuator is short-circuited the comparator hysterisis ensures that an increase in the signal level at terminal 1 must occur before either attenuator is re-inserted.

If the level of the input signal applied to terminal 1 increases further to exceed a reference level applied via line 28 the comparator 15 is triggered and a warning lamp 19 is energised, which indicates that an excessively high input signal is being received which will introduce measurement inaccuracies in the modulation meter. An interlock signal is received from the latch 17 via line 24 to prevent operation of the warning lamp 19 unless both attenuators 3 and 4 are already in circuit.

If a signal is received at the input terminal 1 which is substantially greater than that required to produce illumination of the warning lamp 19, the overload condition is detected by the comparator 7, which sets a latch 8, which in turn operates the switch 2 to open it and also illuminates an overload warning lamp 20. In practice the switch 2 is a magnetically operated relay, since a relay does not distort the radio frequency signal passing through it and it is also capable of withstanding very high open circuit voltages. When the switch 2 is open the line connecting it to terminal 1 is in effect an unmatched radio frequency transmission line and it is possible for very high voltages to appear across the open contacts of the switch 2. Because the switch 2 is a magnetically operated relay, its speed of operation is relatively slow and thus the switch is opened a short predetermined time after the overload condition is detected. This predetermined delay is such that the application for this very short period of the overload signal does not seriously overheat or permanently damage the attenuators 3 and 4 or the frequency changer 10. The latch 8 maintains the switch to open until it is manually re-set by means of re-set button 9.

The circuitry is arranged so that switch 2 is only in the closed condition when the circuitry is energised and the signal input to terminal 1 is below the predetermined overload level. This ensures that the equipment is protected even when the overload protection circuit is not switched on.

As the switch 2 is between the input signal to terminal 1 and the detector 6, the detector is isolated from the input signal source when the said switch opens under overload conditions and thus the detector 6 does not have to withstand the overload condition and is itself protected by the switch 2. As the detector 6 is inoperative when switch 2 is open, latch 8 is necessary to maintain the switch 2 in the open condition until the latch 8 is manually re-set. If the overload condition is still present when the latch 8 is re-set the detector 6 detects the overload and operates the latch 8 to again open the switch 2. The re-set circuit is arranged as a "one shot" system; that is the latch 8 is only re-set when the re-set 9 is initially operated. This prevents the switch 2 repeatedly opening and closing if the re-set is held closed.

We claim:

1. An r.f. circuit for increasing the dynamic range of a measuring instrument while providing protection against overload, said r.f. circuit having an input terminal which in operation receives an applied r.f. input signal having wide variations in amplitude level and said circuit having an output terminal for connection to the measuring instrument;

said r.f. circuit including a switch connected to said input terminal and having an output;

switchable attenuator means connected between said output of the switch and said output terminal for selectively attenuating the r.f. input when the amplitude level thereof reaches a first predetermined amplitude level and including means for detecting the presence of said first predetermined amplitude level of the input signal;

latch means connected to said switch for latching the switch in open and closed conditions and including manual reset means for causing the switch to be latched in the closed condition; and means connected to the output of said switch and to said latch means for detecting the presence of a second predetermined amplitude level of the r.f. input signal and actuating said latch means to cause said switch to be latched in the open condition, said second predetermined amplitude level being greater than said first predetermined level.

* * * * *